(12) United States Patent
Chee

(10) Patent No.: US 10,014,314 B2
(45) Date of Patent: Jul. 3, 2018

(54) SEMICONDUCTOR DEVICE AND METHODS OF MANUFACTURE THEREOF

(71) Applicant: X-FAB SEMICONDUCTOR FOUNDRIES AG, Erfurt (DE)

(72) Inventor: Boon Jiew Chee, Kuching Sarawak (MY)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 15/381,575

(22) Filed: Dec. 16, 2016

(65) Prior Publication Data

US 2017/0179145 A1     Jun. 22, 2017

(30) Foreign Application Priority Data

Dec. 16, 2015  (GB) .................................. 1522236.7

(51) Int. Cl.
| | | |
|---|---|---|
| H01L 27/115 | (2017.01) | |
| H01L 21/28 | (2006.01) | |
| H01L 27/11573 | (2017.01) | |
| H01L 27/11568 | (2017.01) | |
| H01L 21/311 | (2006.01) | |

(52) U.S. Cl.
CPC .. *H01L 27/11573* (2013.01); *H01L 21/28282* (2013.01); *H01L 27/11568* (2013.01); *H01L 21/31111* (2013.01); *H01L 21/31144* (2013.01)

(58) Field of Classification Search
None
See application file for complete search history.

(56) References Cited

U.S. PATENT DOCUMENTS

| | | |
|---|---|---|
| 2005/0239248 A1 | 10/2005 | Lee |
| 2006/0017092 A1 | 1/2006 | Dong et al. |
| 2014/0239374 A1 | 8/2014 | Ramkumar et al. |

OTHER PUBLICATIONS

Combined Search and Examination Report for GB 1522236.7, dated Jun. 1, 2016. 8 pages.

*Primary Examiner* — Asok K Sarkar
(74) *Attorney, Agent, or Firm* — Nixon & Vanderhye PC

(57) ABSTRACT

The invention provides a method for use in forming a semiconductor device, the semiconductor device comprising a primary area and a periphery area, the method comprising: providing a substrate on which is situated: a stack in the primary area, the stack comprising a first oxide layer on the substrate, an oxynitride layer on the first oxide layer and a second oxide layer on the oxynitride layer; and a third oxide layer in the periphery area, the method further comprising: substantially removing the second oxide layer from the primary area and the third oxide layer from the periphery area; forming a fourth oxide layer in at least the primary area by an in situ steam generation (ISSG) process; and thereafter forming a polycrystalline semiconductor layer on the fourth oxide layer without any intervening oxidation process steps. Embodiments of the invention, when applied to, for example, the manufacture of SONOS devices, have the advantages that batch-to-batch variation of the thickness of the top blocking oxide of the ONO stack is reduced or eliminated, and ONO line width variation is reduced or eliminated.

8 Claims, 10 Drawing Sheets

SEMICONDUCTOR DEVICE AND METHODS OF MANUFACTURE THEREOF

This application claims priority to GB Application No. 1522236.7 filed on Dec. 16, 2015, the entire content of which is hereby incorporated by reference.

TECHNICAL FIELD

The present invention relates generally to semiconductor devices and methods of manufacturing same. Embodiments apply in particular, though not exclusively, to integrated circuits, and in particular to SONOS (Silicon-Oxide-Nitride-Oxide-Silicon) memory cells.

BACKGROUND

The background and embodiments of the invention will be described with reference to a SONOS memory cell, but it will be understood that the invention is not limited thereto.

A typical SONOS layer stack of a SONOS memory cell contains the following layer sequence (from top to bottom):
- a polysilicon layer;
- a top blocking oxide layer;
- a silicon oxynitride layer;
- a bottom (or tunnel) oxide layer; and
- a silicon layer (substrate).

The top blocking oxide may for example be formed with, or by, a silicon dioxide ($SiO_2$) layer. The bottom oxide layer may be formed in a similar manner. The bottom silicon layer is typically formed by the substrate, which, in a typical MOSFET type transistor, would contain a channel region between source and drain terminals. Layer thicknesses, impurity content or material variations in the SONOS layer stack are well known to a person skilled in the art. Some non-limiting examples will be given below in the description of embodiments of the invention.

The present inventor has appreciated that the thickness of the top blocking oxide layer of a SONOS memory cell may vary from batch to batch in a typical prior art manufacturing process due to the exposure of the top blocking oxide layer to chemicals such as hot phosphoric acid used to remove a sacrificial capping nitride on top of the top blocking oxide layer. During removal of this sacrificial capping nitride layer by hot phosphoric acid, the top blocking oxide will also be (partly) etched away. The inventor has appreciated that the amount of top blocking oxide loss may be highly influenced by the age of the acid in the etching tank and the number of times the acid in the tank has been used in such processes.

The variation in top blocking oxide thickness from batch to batch may be up to about 20 Å or more when comparing the use of a fresh etchant chemical to the use of an aged etchant chemical in the etching tank. In particular, the variation of top blocking oxide thickness can cause a significant variation in the programming windows of the SONOS cell. It may also result in early reliability failures and yield loss. Thus batch-to-batch thickness variation of the top blocking oxide layer is highly undesirable.

In order to help with the understanding of the present invention we will now describe a typical prior art process in more detail. In this typical prior art process, a SONOS memory cell bottom oxide with a thickness range from about 16 Å to about 20 Å (1 Å=$10^{-10}$ m) and silicon oxynitride with a thickness range from about 100 Å to about 150 Å is formed in a single step in a LPCVD furnace. After the bottom oxide and silicon oxynitride is formed, a top blocking oxide with a thickness range from about 20 Å to about 60 Å is formed by a high temperature LPCVD oxidation furnace or wet oxidation based process by converting some of the silicon oxynitride to top oxide so as to form a top blocking oxide layer on the remaining silicon oxynitride. Subsequently, a capping nitride layer with a thickness range from about 200 Å to about 400 Å is deposited by LPCVD furnace on top of the top blocking oxide. The capping nitride is used as a hard mask in an integration process. Next, an ONO (oxide-nitride-oxide) photoresist mask is used to pattern the device area where the SONOS cell will be defined and where other "non-SONOS" (also referred to as "periphery" in the subsequent text and drawings) areas are to be removed. With the ONO mask, the capping nitride layer will be etched by a highly isotropic dry etching process in the non-SONOS device area until the top blocking oxide is exposed. Next, the ONO mask is stripped. At this stage, the non-SONOS area has an exposed top blocking oxide while the capping nitride layer remains in the SONOS device area. Hydrofluoric (HF) dipping is carried out to remove the top blocking oxide in the non-SONOS device area so as to expose the oxynitride layer, while in the SONOS device area the capping nitride layer remains as a protecting hard mask during HF dipping for the ONO layer located underneath. In the next step, hot phosphoric acid dipping is used to completely remove the silicon oxynitride layer in the non-SONOS device area, while a portion of similar thickness of the capping nitride layer will also be removed in the SONOS device area. After this step, in the SONOS device area, the remaining capping nitride layer with a thickness range from about 100 Å to about 150 Å continues to serve as a hard mask to protect the ONO layer located underneath. In the non-SONOS device area, the silicon oxynitride layer is completely removed so as to expose an implant buffer oxide layer. The next step is the implantation process for the logic devices in the non-SONOS device area (the SONOS device area is masked so that the logic devices will be formed outside the SONOS device area). After the implantation and removal of the photoresist, the implant buffer oxide layer is removed by a HF dipping process so as to expose the bare silicon surface to prepare for the subsequent gate oxidation process. The remaining sacrificial capping nitride layer on top of the ONO device area will be removed by hot phosphoric acid in the next step, which finally exposes the top blocking oxide layer in the SONOS device area. During removal of this capping nitride using hot phosphoric acid, the top blocking oxide will be partially removed and the amount (or thickness) that is removed is highly uncontrollable. The amount removed will be influenced by the age of the hot phosphoric acid and the number of process cycles which the hot phosphoric acid in the tank has previously been subjected to, as described earlier. The thickness of the top blocking oxide removed due to the hot phosphoric acid may vary from 0 Å to about 20 Å depending on the type of top blocking oxide used in the SONOS memory cell. Thus the individual film layer thicknesses of the ONO layers (which at this point in the process have been finally determined) may vary from batch to batch. The process then continues with subsequent gate oxidation processes which together constitute a triple gate oxidation process. This triple gate oxidation forms the gate oxides for the High Voltage (HV), Medium Voltage (MV) and Low Voltage (LV) devices in the non-SONOS device area. The first gate oxidation step in this triple gate oxidation results in an oxidation with a thickness range from about 80 Å to about 90 Å on the entire wafer. This is followed by the application of a photoresist mask to pattern the HV region. Using this HV mask, the oxidation in the MV/LV region will be removed by a HF wet etch. After photoresist removal and cleans, a second gate oxidation with a thickness range from about 70 Å to about 80 Å is then performed in a furnace dry oxidation tool. This is followed by application of a photoresist mask to mask the HV/MV region, and etching of the LV region by a HF wet etch. After photoresist removal and cleans, a third gate oxidation with in situ steam generation gate oxidation (ISSG) is then grown in a rapid thermal oxidation tool for the LV (low voltage) device with a thickness range from about 20 Å to about 35 Å in silicon. During the triple gate oxidation process, the SONOS device area will be exposed to a marginal increase of oxide on top of the original top blocking oxide (20-60 Å), resulting in a final top blocking oxide thickness of approximately 25-65 Å. Finally, in the HV region the gate oxide will be approximately 120-130 Å, in the MV region it will be 70-80 Å and in the LV region it will be 20-30 Å. Finally, gate polysilicon with a thickness range from about 1500 Å to about 2500 Å is deposited as the gate electrode for the SONOS device and periphery devices.

SUMMARY

It is an aim of at least some embodiments of the present invention to provide an alternative process scheme or method to the one described above for use in manufacturing a SONOS memory cell. It is a particular aim of certain embodiments to reduce or eliminate the top blocking oxide thickness variation which may occur between different batches due to the age and cycle count of the phosphoric acid, as described above. It is a further such aim of certain embodiments to reduce or eliminate ONO line width variation which may occur between different batches. It is a further such aim to provide devices manufactured in accordance with these methods.

Aspects of the invention are set out in the independent claims.

Embodiments of the invention can be performed without the use of a sacrificial capping nitride layer and therefore render the use of a hot phosphoric chemical in the manufacturing process unnecessary. In addition, in some embodiments of the present invention the ONO line width variation—which in a typical prior art manufacturing process is a result of the isotropic etching behavior of the hot phosphoric acid during removal of the capping nitride—can be reduced.

In certain embodiments the top blocking oxide of the ONO stack of the SONOS memory cell is manufactured in the last stage using an in situ steam generation (ISSG) gate oxidation process, immediately prior to gate polysilicon deposition. This may ensure that the top blocking oxide will not be further subjected to any changes. Methods according to embodiments of the invention may also ensure, or at least improve, the repeatability of the top blocking oxide thickness and prevent ONO line width shrinkage. Such methods may also reduce cost and manufacturing cycle time.

BRIEF DESCRIPTION OF THE DRAWINGS

Some embodiments of the invention will now be described by way of example only and with reference to the accompanying drawings, in which.

DETAILED DESCRIPTION

Figure 1:
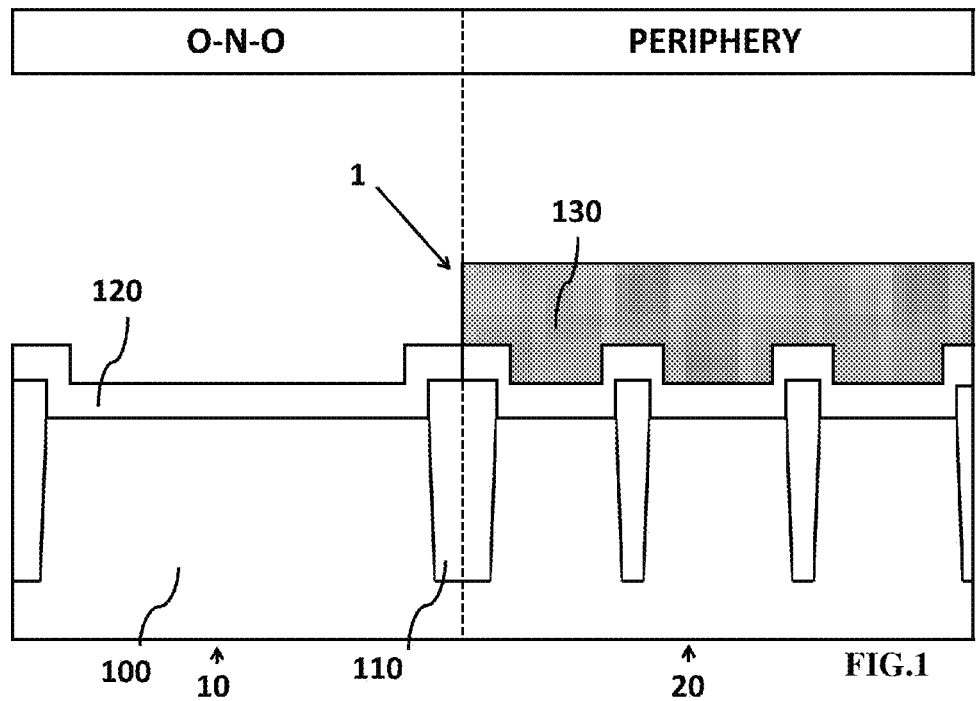
FIG. 1 shows a first stage of a method for use in manufacturing a semiconductor device in accordance with an embodiment of the present invention.

FIG. 1 shows the first stage of a method for use in manufacturing a semiconductor device in accordance with an embodiment of the present invention. As illustrated in FIG. 1, the semiconductor device 1 is formed with a substrate 100, e.g. a silicon substrate. Insulators 110, e.g. field oxide insulators, are formed in the substrate surface. The semiconductor device 1 can be regarded as being divided into an ONO area 10 and a periphery area 20 (or non-SONOS area 20). A sacrificial oxide layer 120 with a thickness of approximately 100-130 Å is applied over the substrate surface and the insulators 110. One skilled in the art will know how to make the device 1 described so far (with substrate 100, insulators 110 and sacrificial oxide layer 120), and therefore the corresponding method steps are not illustrated individually.

Figure 2:
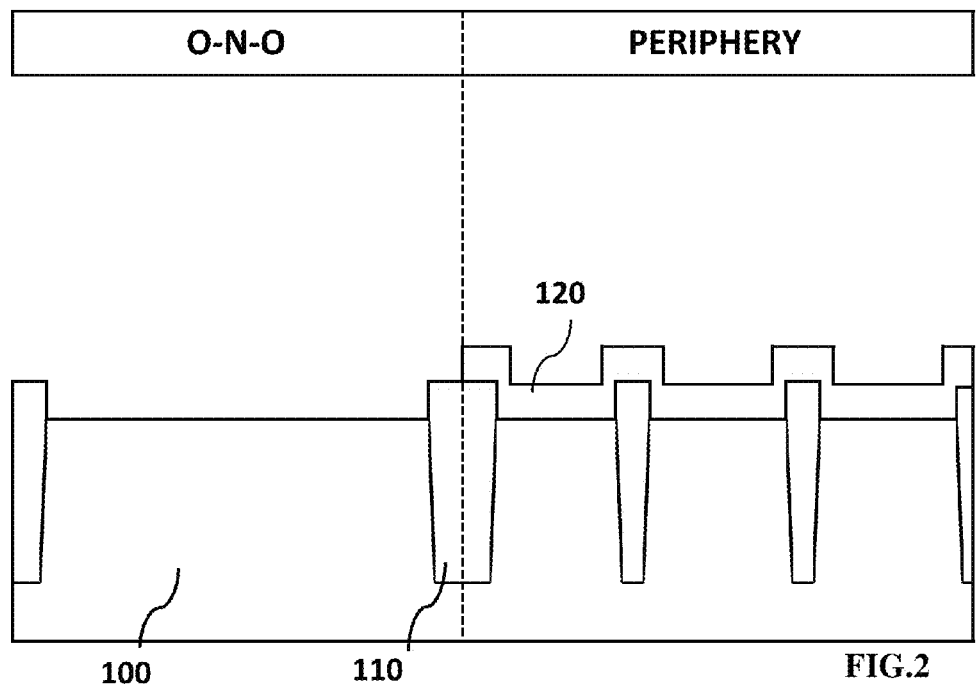
FIG. 2 shows a second stage of a method for use in manufacturing a semiconductor device in accordance with an embodiment of the present invention.

As shown in FIG. 1, a photoresist mask 130 is applied in the form of a layer over the sacrificial oxide layer 120 in the periphery area 20 only. Hydrofluoric acid (HF) is then used to remove the sacrificial oxide 120 in the ONO area 10 whilst the photoresist mask 130 protects the sacrificial oxide layer 120 in the periphery area 20. The photoresist mask 130 is then stripped, which leaves the sacrificial oxide layer 120 exposed in the periphery area. The result is shown in FIG. 2.

Figure 3:
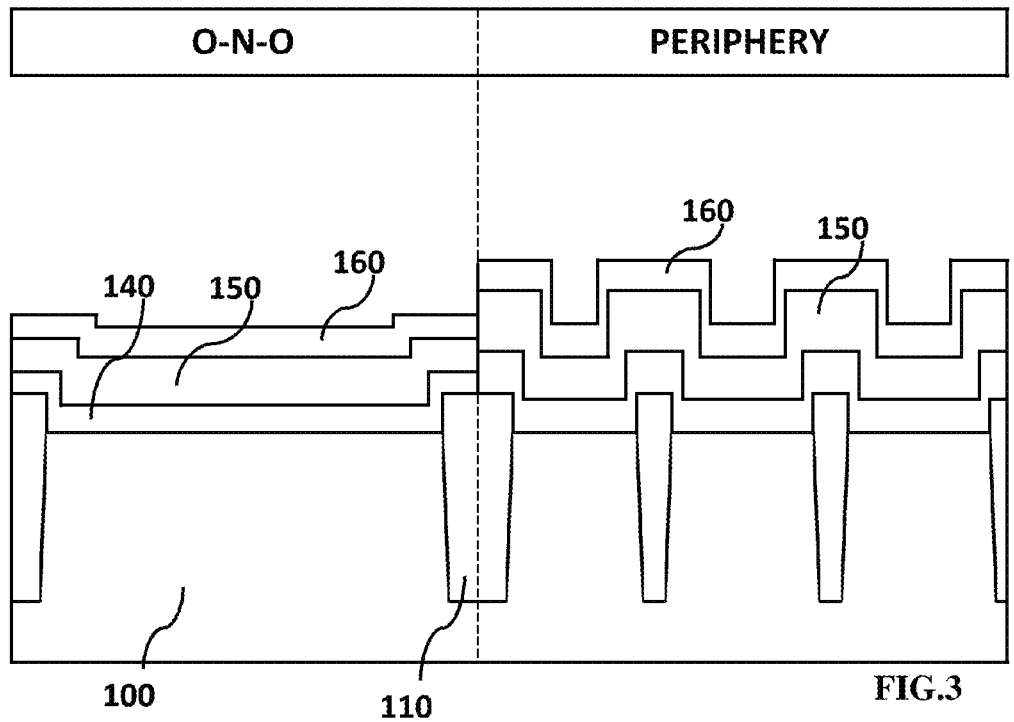
FIG. 3 shows a third stage of a method for use in manufacturing a semiconductor device in accordance with an embodiment of the present invention.

As shown in FIG. 3, bottom oxide, silicon oxynitride and top oxide layers 140, 150, 160 are then formed in both the ONO area and the periphery area. The bottom oxide layer 140 may have a thickness in a range from about 16 Å to 20 Å, the silicon oxynitride layer 150 from about 100 Å to 150 Å and the top blocking oxide layer 160 from about 80 Å to 120 Å. This top blocking oxide serves as a sacrificial layer which will not be part of the final SONOS device. The bottom oxide in the periphery area is thicker than in the ONO area since the original sacrificial oxide is still in place in the periphery area. In general the silicon oxynitride layer 150 may actually be formed of multiple distinct silicon oxynitride layers, each with different relative proportions of oxygen, nitrogen and silicon. However, according to an embodiment the silicon oxynitride layer 150 is homogenous, i.e. not comprising multiple distinct layers.

Figure 4:
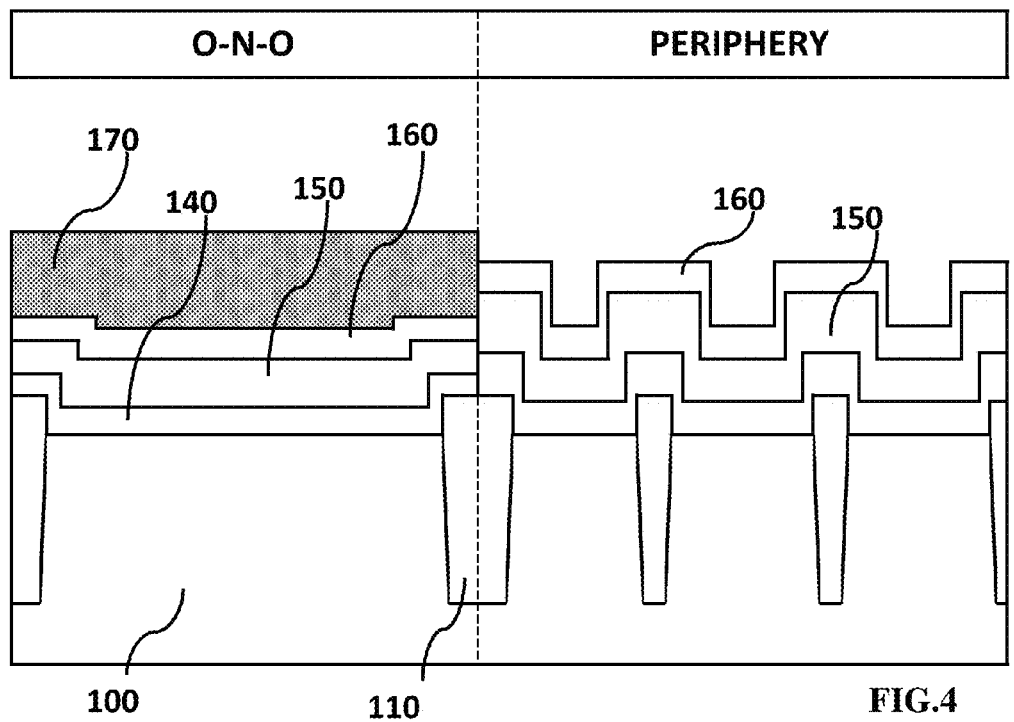
FIG. 4 shows a fourth stage of a method for use in manufacturing a semiconductor device in accordance with an embodiment of the present invention.

Subsequently, as shown in FIG. 4, a photoresist mask 170 is applied over the ONO area only. This mask patterning will define the SONOS device location and the periphery device location(s).

Figure 5:
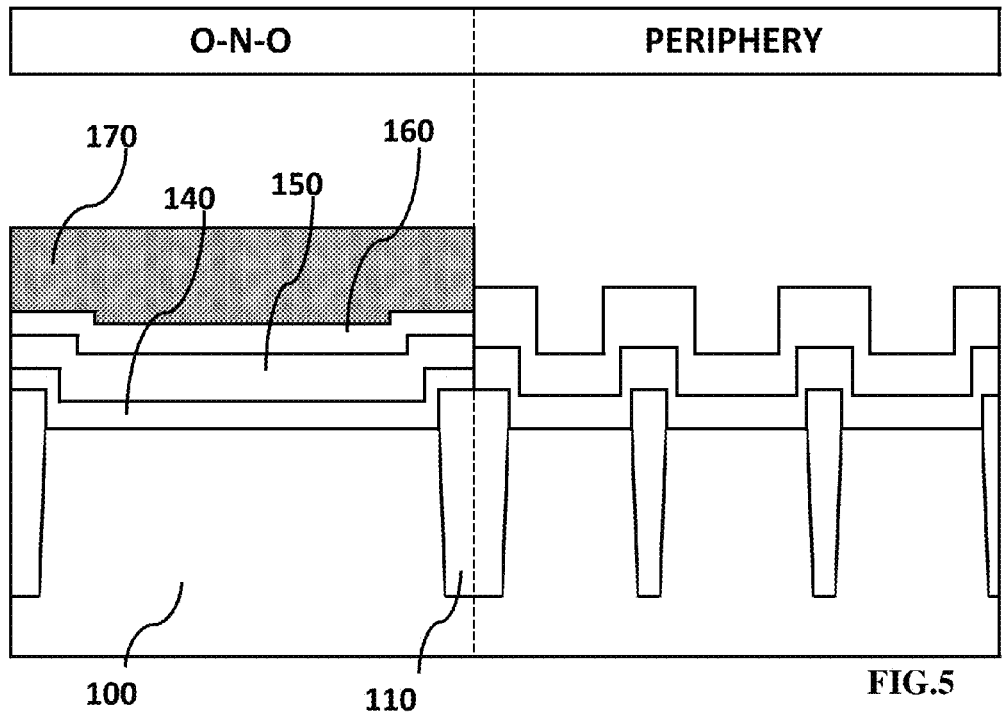
FIG. 5 shows a fifth stage of a method for use in manufacturing a semiconductor device in accordance with an embodiment of the present invention.

As the photoresist mask 170 is not present in the periphery area, the top blocking oxide will be completely removed from the periphery area by a short time application of HF acid. The result is illustrated in FIG. 5.

Figure 6:
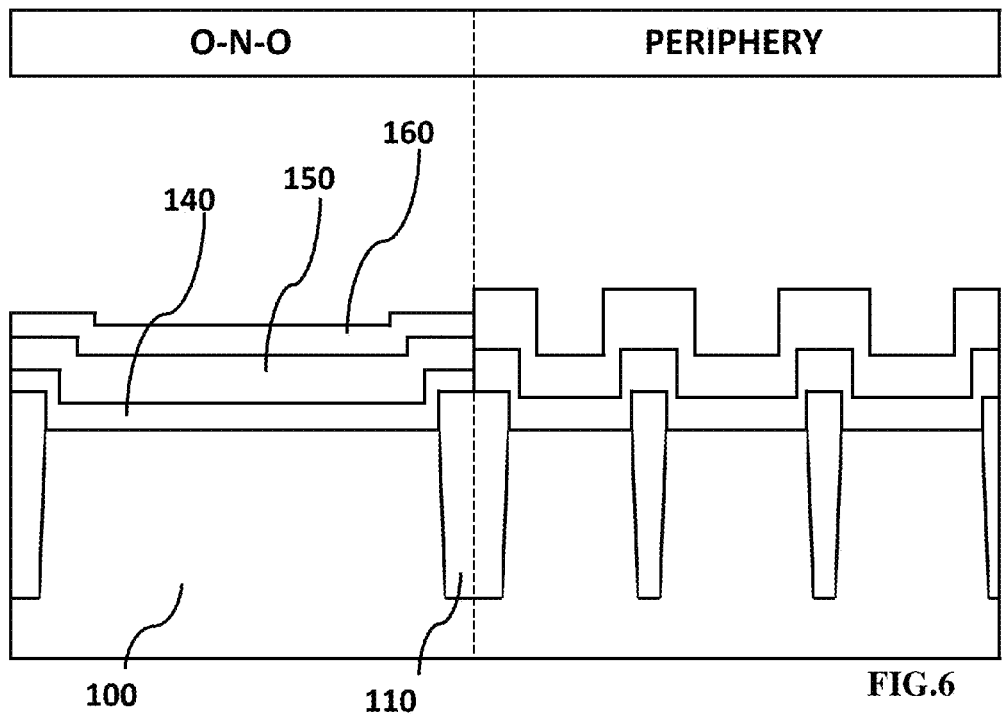
FIG. 6 shows a sixth stage of a method for use in manufacturing a semiconductor device in accordance with an embodiment of the present invention.

As illustrated in FIG. 6, the photoresist mask 170 is then stripped off. As can be seen, the sacrificial oxide 120 (as well as bottom oxide 140 and silicon oxynitride 150) remains in the periphery area 20, whereas the triple layer of bottom oxide 140, silicon oxynitride 150 and top oxide 160 remains in the ONO area 10.

Figure 7:
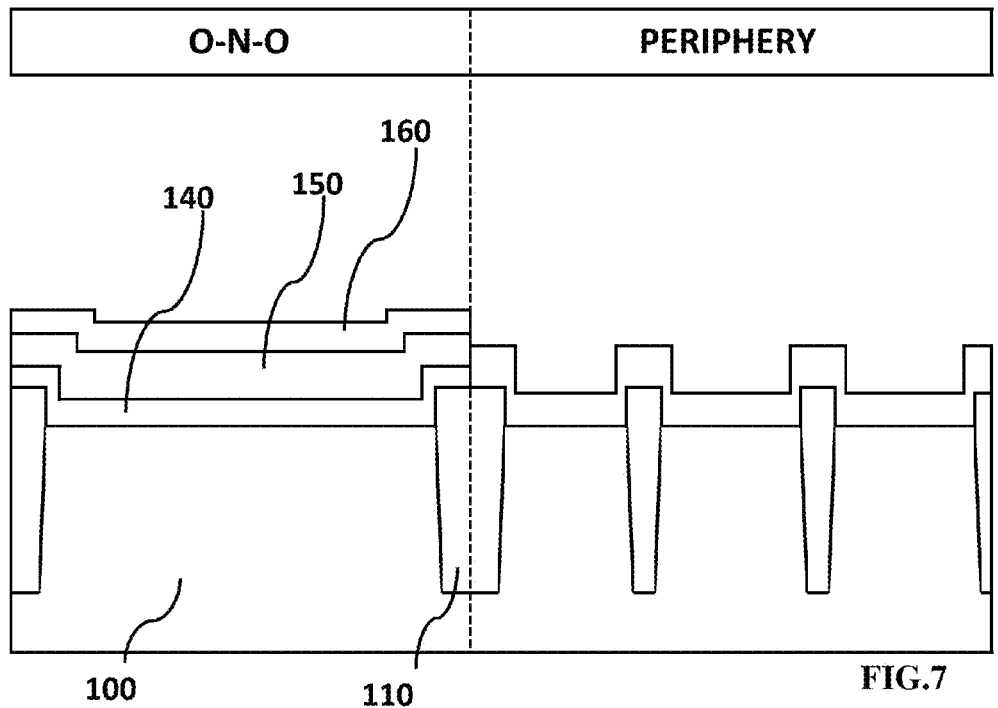
FIG. 7 shows a seventh stage of a method for use in manufacturing a semiconductor device in accordance with an embodiment of the present invention.

In the next step, illustrated in FIG. 7, a short hot phosphoric dipping completely removes the silicon oxynitride layer 150 in the periphery area thus exposing the combined sacrificial oxide layer and bottom oxide layer 140. The triple layer of bottom oxide 140, silicon oxynitride 150 and top oxide 160 generally remains in the ONO area 10, although the hot phosphoric dipping may reduce the thickness of the combined sacrificial oxide and bottom oxide 140 in the periphery area and the top oxide layer 160 in the ONO area slightly, e.g. in the range of 0-3 Å. However, any intermediate reduction of the top oxide layer 160 in the ONO area is not important at this stage since it will be removed in a subsequent step. Neither is it important that the thickness of the combined sacrificial oxide and bottom oxide 140 in the periphery area may have been reduced.

Figure 8:
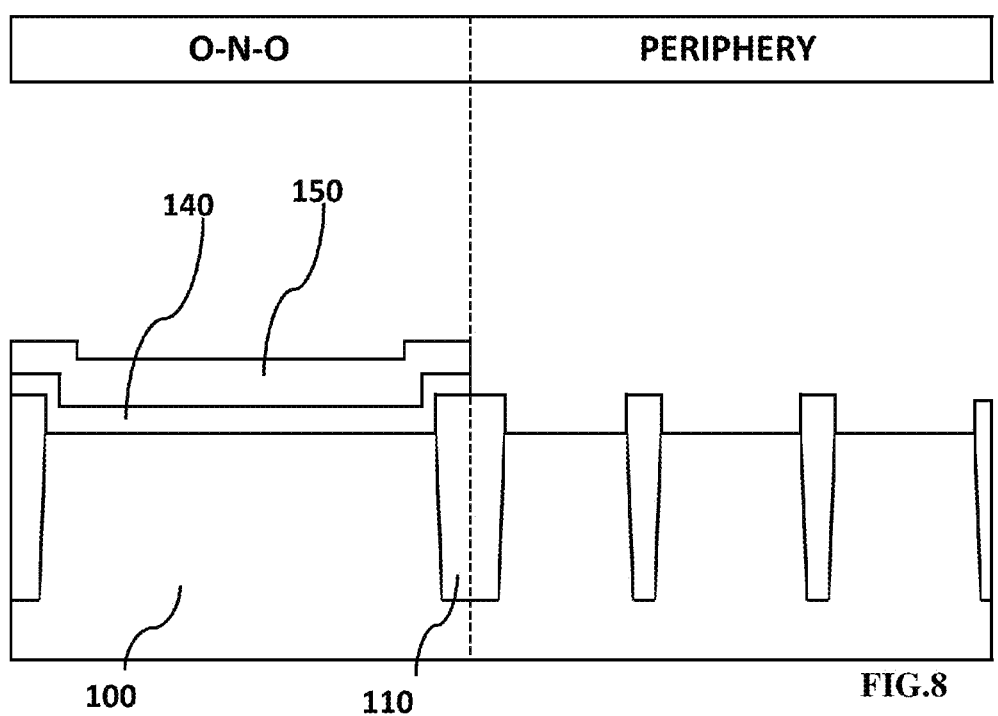
FIG. 8 shows an eighth stage of a method for use in manufacturing a semiconductor device in accordance with an embodiment of the present invention.

After a well implantation process (not shown; but known to one skilled in the art) for the periphery area 20, HF acid is applied for a short time to remove the combined sacrificial oxide and bottom oxide 140 in the periphery area 20 and to remove the entire top blocking oxide 160 in the ONO area 10. As shown in FIG. 8, the remaining film layer combination at this stage in the ONO area 10 will be the bottom oxide 140 and silicon oxynitride 150, whilst in the periphery area 20 the silicon surface will be exposed.

Figure 9:
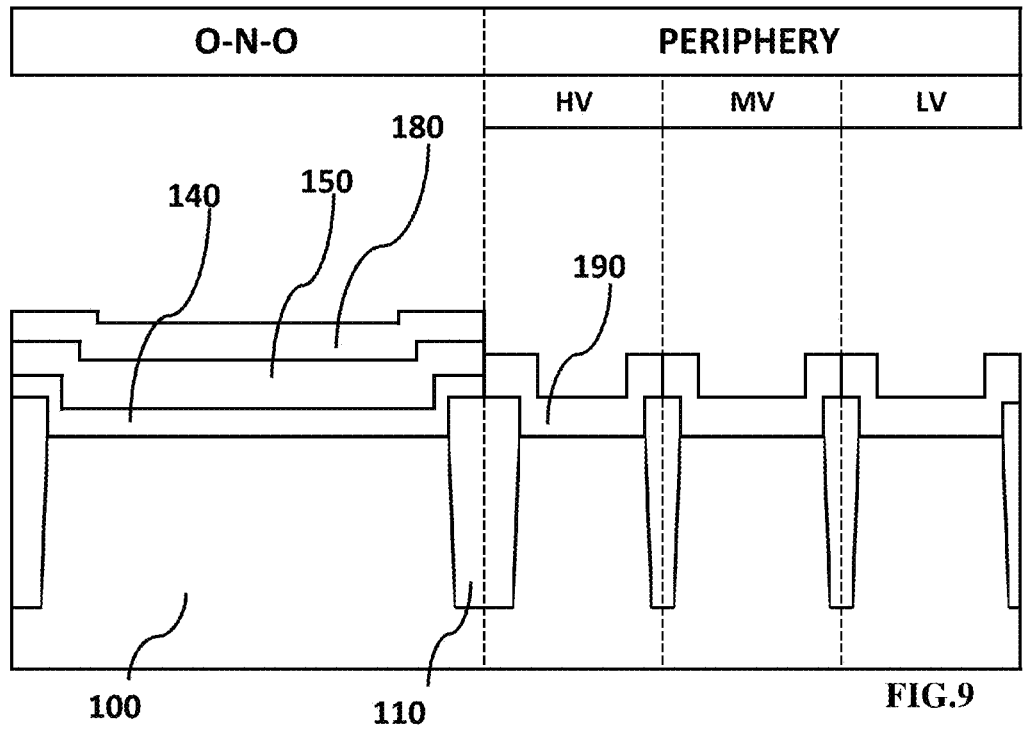
FIG. 9 shows a ninth stage of a method for use in manufacturing a semiconductor device in accordance with an embodiment of the present invention.

In a subsequent step, illustrated in FIG. 9, a gate oxide 190—or at least a first layer thereof—is created in the periphery area 20 by means of a first gate oxidation. At this stage the gate oxide 190 may have a thickness of about 80 Å to 90 Å in a high-voltage (HV) region of the periphery area, and also in a low-voltage (LV) region and a medium-voltage (MV) region, see FIG. 9. This oxidation process also creates a (minimal) oxide layer 180 of less than about 5 Å in the ONO area.

Figure 10:
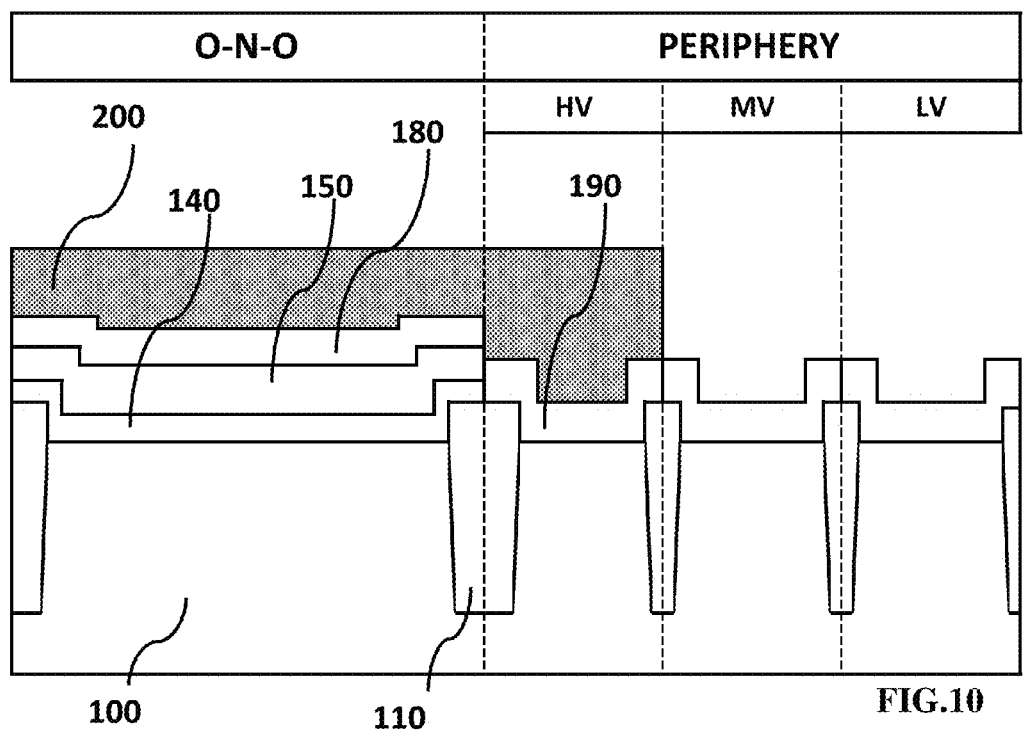
FIG. 10 shows a tenth stage of a method for use in manufacturing a semiconductor device in accordance with an embodiment of the present invention.

This is followed, as shown in FIG. 10, by the application of a photoresist mask 200 over the ONO area 10 and the HV region of the periphery area 20, adjacent the ONO area. The MV and LV regions remain free of the mask 200.

Figure 11:
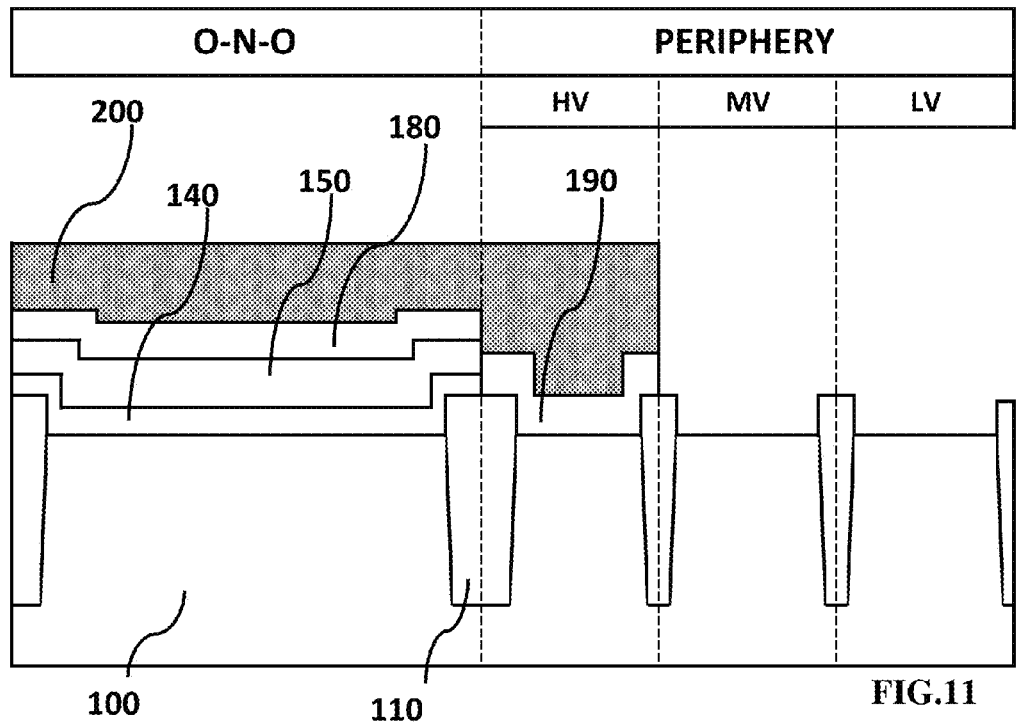
FIG. 11 shows an eleventh stage of a method for use in manufacturing a semiconductor device in accordance with an embodiment of the present invention.

Referring to FIG. 11, the photoresist mask 200 is then used to remove the unwanted gate oxide 190 in the MV and LV regions. The gate oxide 190 in the MV and LV regions may be removed with HF acid. The gate oxide 190 in the HV region and minimal oxide layer 180 in the ONO area are not removed by the HF acid due to the photoresist mask covering these regions.

Figure 12:
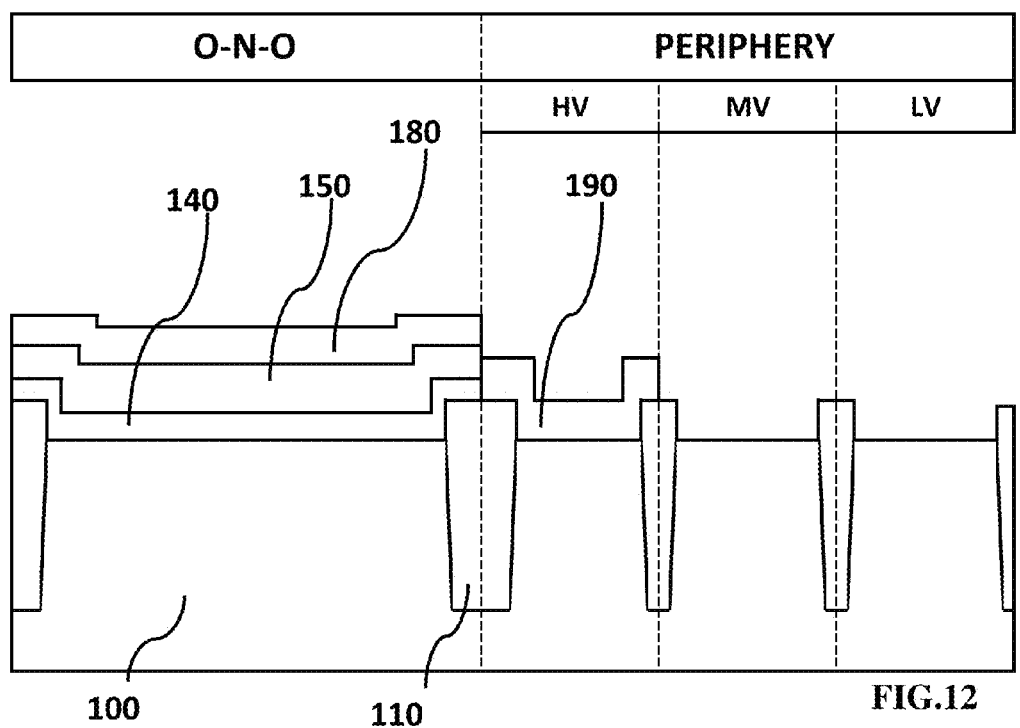
FIG. 12 shows a twelfth stage of a method for use in manufacturing a semiconductor device in accordance with an embodiment of the present invention.

The photoresist mask 200 is then removed, the result being illustrated in FIG. 12.

Figure 13:
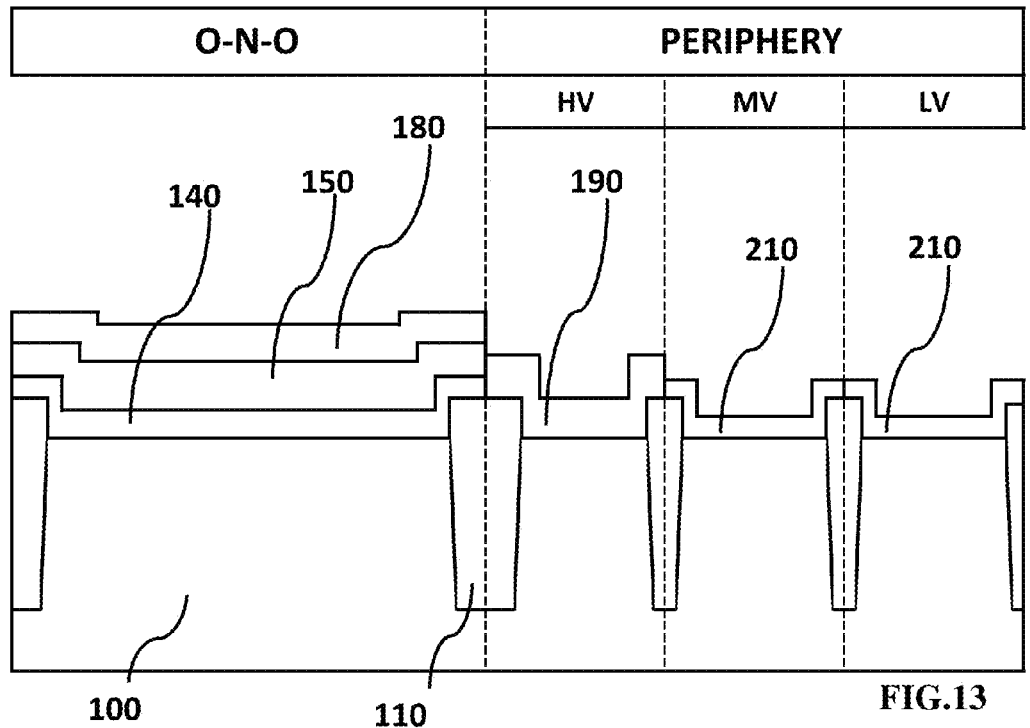
FIG. 13 shows a thirteenth stage of a method for use in manufacturing a semiconductor device in accordance with an embodiment of the present invention.

As shown in FIG. 13, a second gate oxidation is then grown in the ONO and periphery areas. This second gate oxidation may be thermally grown. In the MV and LV regions the second gate oxidation forms a layer 210 with a thickness of about 70 Å to 80 Å.

In the HV region of the periphery 20 and in the ONO area 10 the second gate oxidation is not shown as a separate layer as it grows on the oxide layers 180 (ONO area) and 190 (HV region of periphery). The total oxide thickness may be about 110 Å to 120 Å in the HV area of the periphery and the second gate oxidation may result in a thickness increase of less than 5 Å in the ONO area.

Figure 14:
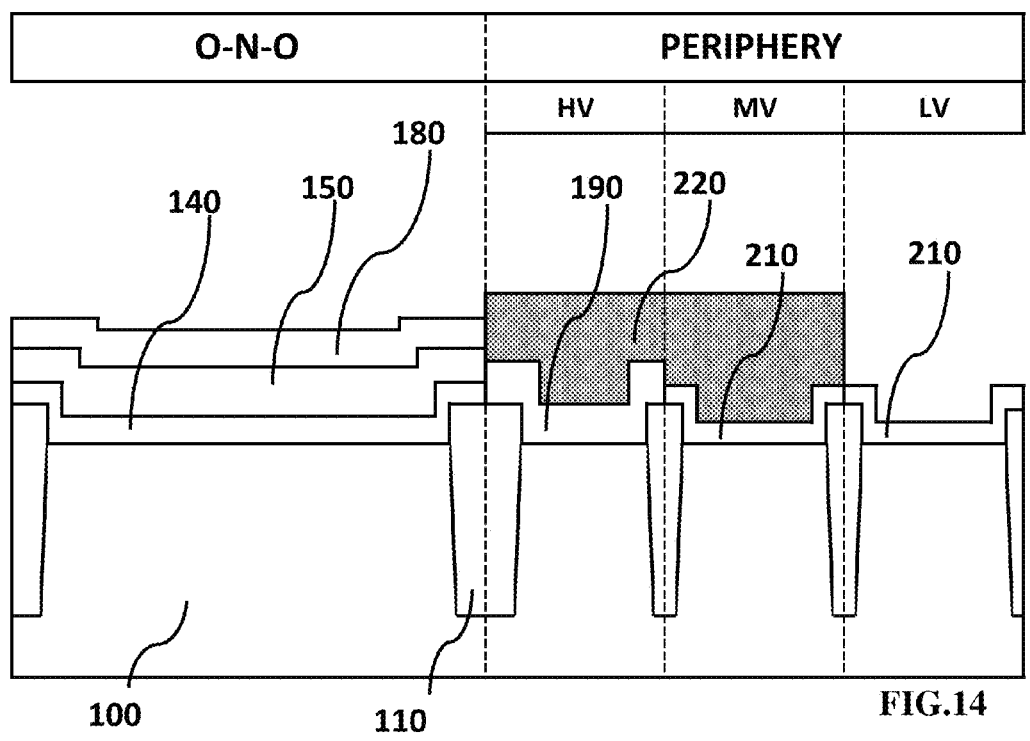
FIG. 14 shows a fourteenth stage of a method for use in manufacturing a semiconductor device in accordance with an embodiment of the present invention.

Subsequently, as shown in FIG. 14, a photoresist mask 220 is applied over the HV and MV regions of the periphery area 20. Both the LV region of the periphery area 20 and the ONO area 10 remain free of the mask 220.

Figure 15:
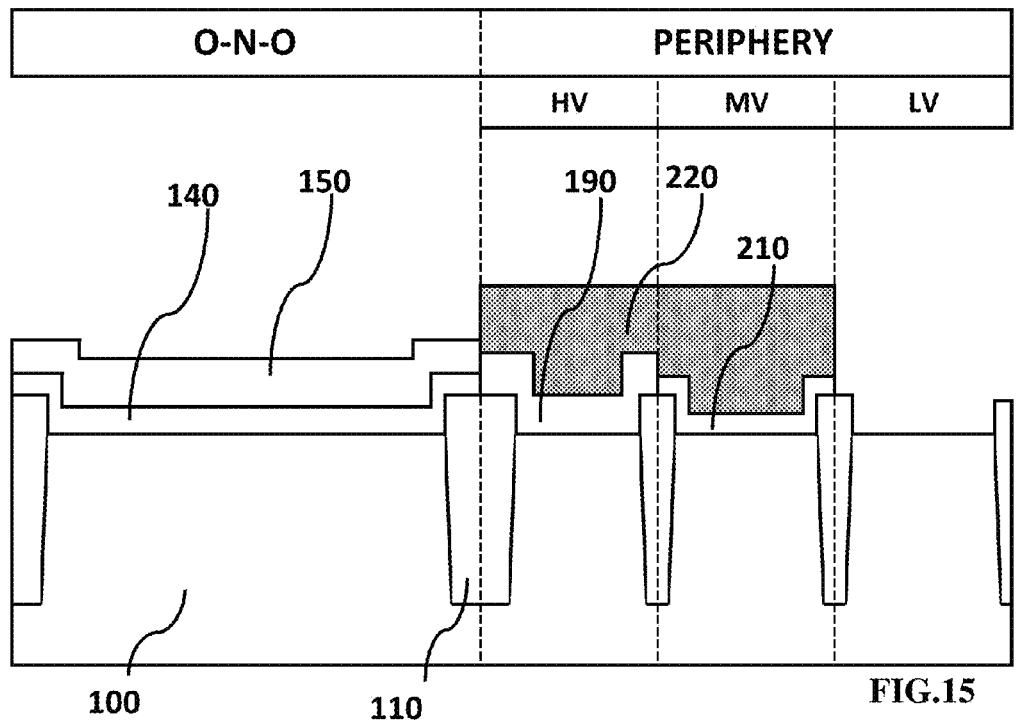
FIG. 15 shows a fifteenth stage of a method for use in manufacturing a semiconductor device in accordance with an embodiment of the present invention.

Referring to FIG. 15, the photoresist mask 220 is then used to enable the gate oxide 210 in the LV region and the oxide layer 180 in the ONO area to be removed in a single process step, i.e. the gate oxide 210 in the LV region and the oxide layer 180 in the ONO area are etched simultaneously, for example with HF acid. The gate oxide 190 in the HV region and gate oxide 210 in the MV region are not removed.

Figure 16:
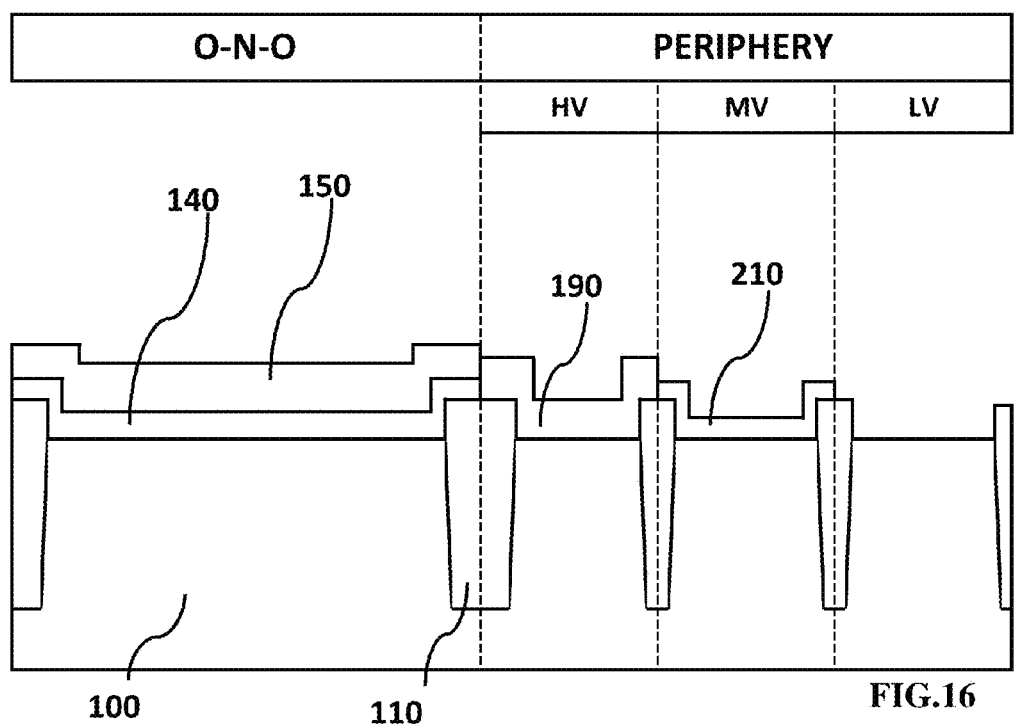
FIG. 16 shows a sixteenth stage of a method for use in manufacturing a semiconductor device in accordance with an embodiment of the present invention.

The photoresist mask 220 is then removed, the result being illustrated in FIG. 16.

Figure 17:
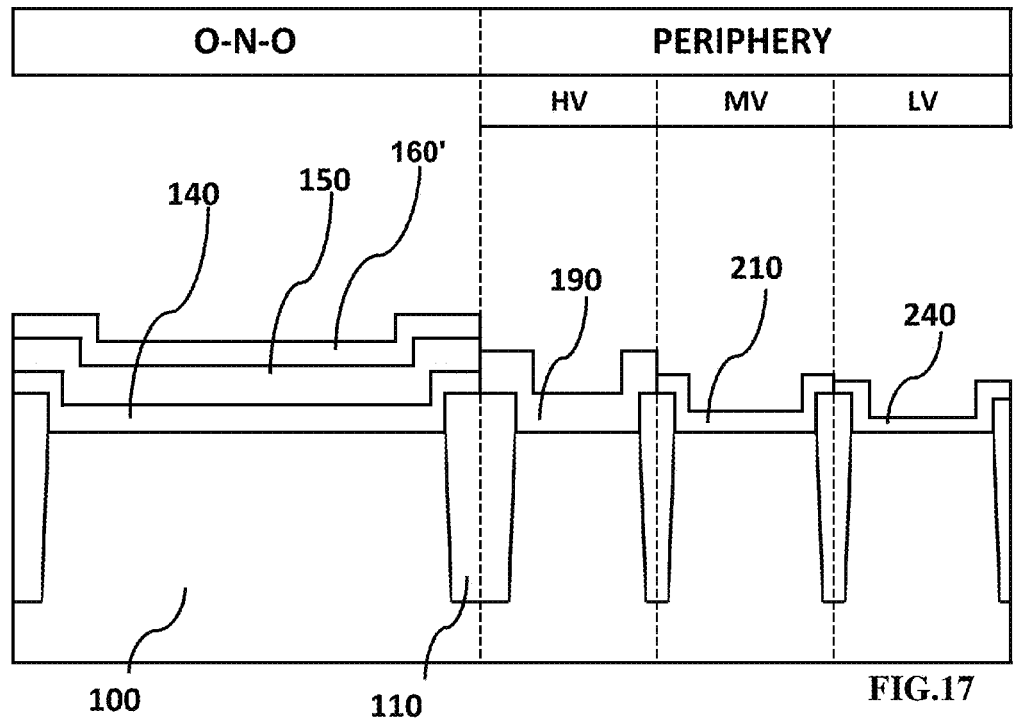
FIG. 17 shows a seventeenth stage of a method for use in manufacturing a semiconductor device in accordance with an embodiment of the present invention.

With reference to FIG. 17, a third gate oxidation step with an in-situ steam generation (ISSG) process in a rapid thermal processing chamber is subsequently performed to grow a final oxide layer in the ONO and periphery areas. During ISSG oxidation, the silicon oxynitride in the ONO area will be partially consumed to grow an oxide layer which will form the top blocking oxide 160' for the SONOS memory cell. The final top blocking oxide 160' in the ONO area may have a thickness of about 20 Å to 30 Å. The ISSG rapid thermal processing technique under low pressure grows approximately 20 Å to 30 Å gate oxide 240 in the LV region. However, with ISSG oxidation not much oxide can be grown on the existing oxide 190 and 210 in the HV and MV regions respectively.

The concentration of the hydrogen in the ISSG process may be adjusted depending on the desired final thickness of the top blocking oxide 160' in the ONO area.

The ISSG gate oxidation completes the formation of the ONO stack for the SONOS memory cell. A subsequent RCA cleaning step may be performed, which doesn't affect the ONO top blocking oxide 160' thickness.

Figure 18:
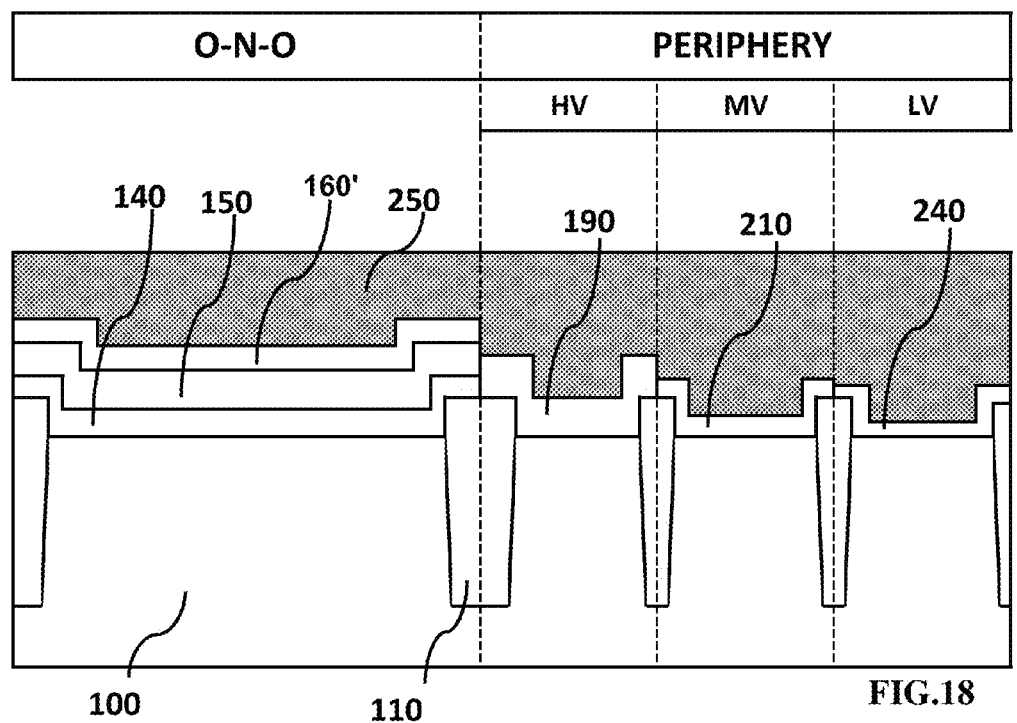
FIG. 18 shows an eighteenth stage of a method for use in manufacturing a semiconductor device in accordance with an embodiment of the present invention.

As shown in FIG. 18, polysilicon 250 with a thickness of about 1500 Å to 2500 Å is then deposited on the oxide layers 160', 190, 210 and 240. In an embodiment there are no intervening oxidation processes between the ISSG gate oxidation and the polysilicon deposition. There may also be no intervening etching processes.

Figure 19:
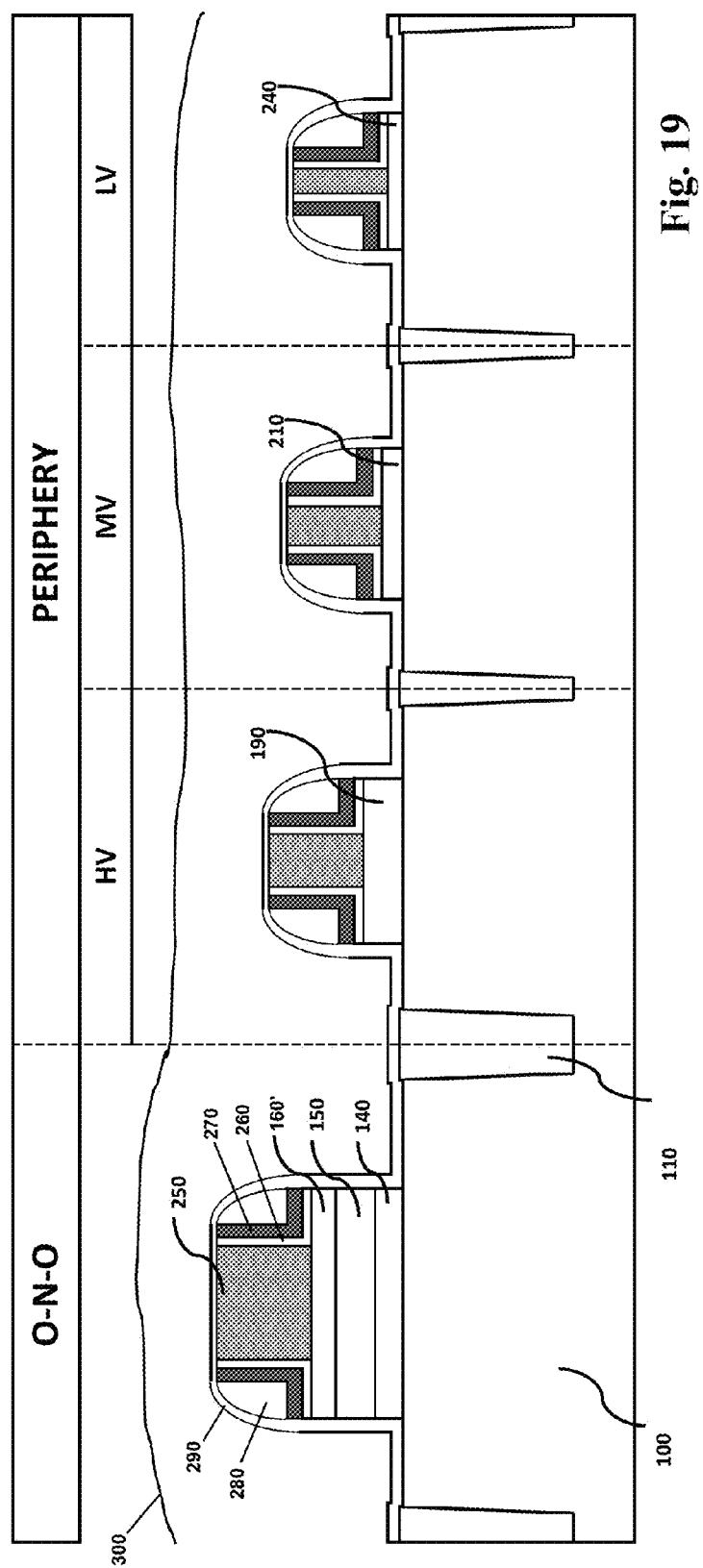
FIG. 19 shows a finalized semiconductor device in accordance with an embodiment of the present invention.

It would be appreciated by one skilled in the art that after polysilicon deposition, as depicted in FIG. 18, it is typical to perform a number of additional processing steps to complete formation of the SONOS device, such as, but not exclusively: etching the polysilicon 250, oxide and oxynitride layers in the regions between the ONO stack and HV/MV/LV regions; depositing sidewall spacers; and depositing a dielectric layer. FIG. 19 shows an example finalized SONOS device comprising: LPCVD oxide layers 260 for the sidewall structure; LPCVD nitride layers 270 for the sidewall structure; LPCVD oxide layers 280 for the sidewall structures; plasma-enhanced CVD nitride layers 290 for the contact etch stop layers; and an interlayer dielectric (e.g. oxide) layer 300.

As illustrated above, embodiments of the present invention may help to reduce or eliminate thickness variation of the top oxide layer 160'. Embodiments of the invention can therefore help to ensure that the thickness of the SONOS cell triple layer can be precisely controlled (or at least more precisely controlled than according to prior art techniques) and the thickness variation between different batches can be reduced or eliminated. This may therefore help to produce devices with stable electrical performance and consistent top blocking oxide formation for the SONOS cell.

Embodiments of the invention may have another advantage, and that is that the line width (which can be regarded as a critical dimension) of the ONO stack can be precisely controlled (or at least more precisely controlled than according to some prior art techniques). This is due to the lateral encroachment behaviour of the hot phosphoric chemical (whereby the acid will etch into the ONO nitride due to lateral encroachment), the use of which is rendered unnecessary in accordance with embodiments of the invention. The elimination of the use of silicon nitride as a hard mask and hot phosphoric acid may enable memory arrays to be reduced in size, particularly for technology of 0.13 µm and beyond.

Embodiments of the invention may reduce cost and cycling time as the process complexity can be reduced due to elimination of SiN hard mask materials and the subsequent hot phosphoric removal process.

One skilled in the art would appreciate that references to oxide and oxynitride layers are specific examples of dielectric and charge-trapping layers respectively. Similarly, other semiconducting materials may be used in place of silicon, and other polycrystalline semiconducting materials may be used in place of polysilicon. It would also be appreciated by one skilled in the art that although the embodiment described hereinbefore comprises HV, MV and LV devices in the periphery region, the invention also applies to SONOS devices comprising any combination or subset of these, in any lateral spatial arrangement with respect to the ONO stack.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A method for use in forming a semiconductor device, the semiconductor device comprising a primary area and a periphery area, the method comprising:
   providing a substrate on which is situated:
      a stack in the primary area, the stack comprising a first oxide layer on the substrate, an oxynitride layer on the first oxide layer and a second oxide layer on the oxynitride layer; and
      a third oxide layer in the periphery area, the method further comprising:
   substantially removing the second oxide layer from the primary area and the third oxide layer from the periphery area;
   forming a fourth oxide layer in at least the primary area by an in situ steam generation (ISSG) process; and
   thereafter forming a polycrystalline semiconductor layer on the fourth oxide layer without any intervening oxidation process steps.

2. The method according to claim 1, wherein the polycrystalline semiconductor layer is formed on the fourth oxide layer without any intervening etching process steps.

3. The method according to claim 1, wherein the second oxide layer in the primary area and the third oxide layer in the periphery area are removed in a single process step.

4. The method according to claim 1, wherein the ISSG process is carried out in a rapid thermal processing chamber.

5. The method according to claim 1, wherein the removal of the second and third oxide layers is performed using hydrofluoric acid.

6. The method according to claim 1, further comprising setting the concentration of hydrogen in the ISSG process to obtain a desired thickness of the fourth oxide layer in the primary area.

7. The method according to claim 1, further comprising performing RCA cleaning prior to forming the polycrystalline semiconductor layer.

8. The method according to claim 1, wherein the semiconductor device is a SONOS device.

* * * * *